US012601946B1

(12) United States Patent
Vehkaperä et al.

(10) Patent No.: US 12,601,946 B1
(45) Date of Patent: Apr. 14, 2026

(54) APPARATUS, SYSTEM AND METHOD FOR CONTROLLING TEMPERATURE OF BACKLIGHT UNIT OF DISPLAY SYSTEM

(71) Applicant: Distance Technologies Oy, Helsinki (FI)

(72) Inventors: Ville Vehkaperä, Oulu (FI); Petri Savolainen, Espoo (FI); Mikko Juhola, Muurla (FI)

(73) Assignee: Distance Technologies Oy, Helsinki (FI)

( * ) Notice: Subject to any disclaimer, the term of this patent is extended or adjusted under 35 U.S.C. 154(b) by 0 days.

(21) Appl. No.: 19/097,939

(22) Filed: Apr. 2, 2025

(51) Int. Cl.
| | |
|---|---|
| *G02F 1/00* | (2006.01) |
| *G02F 1/1335* | (2006.01) |
| *H05K 7/20* | (2006.01) |
| *G02F 1/13357* | (2006.01) |

(52) U.S. Cl.
CPC ... *G02F 1/133628* (2021.01); *H05K 7/20263* (2013.01); *G02F 1/133603* (2013.01)

(58) Field of Classification Search
CPC ................................................. H05K 7/20263
See application file for complete search history.

(56) References Cited

U.S. PATENT DOCUMENTS

| | | | | |
|---|---|---|---|---|
| 9,063,367 | B2 * | 6/2015 | Hu | G02F 1/133608 |
| 2007/0221943 | A1 * | 9/2007 | Moriya | G02F 1/133603 |
| | | | | 257/686 |
| 2016/0349566 | A1 * | 12/2016 | Na | G02F 1/133608 |
| 2018/0217449 | A1 * | 8/2018 | Mifune | G02F 1/133605 |

* cited by examiner

*Primary Examiner* — Gerald J Sufleta, II
(74) *Attorney, Agent, or Firm* — Ziegler IP Law Group, LLC.

(57) ABSTRACT

An apparatus for controlling temperature of backlight unit of display system includes: hollow heat transfer element arranged between optical element(s) of backlight unit and printed circuit board of backlight unit when apparatus is in use, wherein a first heat transfer fluid circulates within hollow space of hollow heat transfer element when apparatus is in use, to thermally couple hollow heat transfer element with at least one of: light-emitting elements arranged on printed circuit board, printed circuit board; and heat exchanger thermally coupled to hollow heat transfer element when apparatus is in use, wherein heat exchanger controls temperature of backlight unit to lie within a predefined operating temperature range, by exchange of thermal energy between heat exchanger and hollow heat transfer element via first heat transfer fluid.

14 Claims, 8 Drawing Sheets

RECEIVE FIRST TEMPERATURE OF BACKLIGHT UNIT
402

IS FIRST TEMPERATURE
RANGE LYING OUTSIDE
PREDEFINED
OPERATING
TEMPERATURE RANGE
404

YES

NO

CONTROL HEAT
EXCHANGER TO BRING
FIRST TEMPERATURE
WITHIN PREDEFINED
OPERATING TEMPERATURE
RANGE
406

DO NOT CONTROL HEAT
EXCHANGER
408

APPARATUS, SYSTEM AND METHOD FOR CONTROLLING TEMPERATURE OF BACKLIGHT UNIT OF DISPLAY SYSTEM

TECHNICAL FIELD

The present disclosure relates to apparatuses for controlling temperature of backlight units of display systems. Moreover, the present disclosure relates to systems for controlling temperature of backlight units of display systems. Furthermore, the present disclosure relates to methods for controlling temperature of backlight units of display systems.

BACKGROUND

In modern automotive design, the ability to provide essential information to users in a seamless and efficient manner is essential for enhancing both safety and driving experience. Typically, high luminance display systems, such as those used in automotive head-up displays (HUDs), have emerged as a key technology, projecting vital information, such as speed, navigation, warnings, and similar, directly onto a windshield, ensuring that the users can access this information without looking away from road. Notably, for HUD systems to function reliably in a real-world environment, said HUD systems must perform consistently under a wide range of temperatures. However, an increased luminance output generates substantial heat which, if not properly managed, can degrade performance of the high luminance display systems (for example, when used in the HUD systems degrades performance of said HUD systems), and negatively impact optical components of the high luminance display systems. Thus, automotive environments can be particularly harsh, subjecting the HUD systems to extreme cold and heat, which poses a significant challenge in maintaining clarity, responsiveness, and operational integrity of a display.

Conventionally, various approaches have been developed to manage heat in the high-luminance display systems. For example, passive cooling techniques, such as heat sinks and thermal conduction pathways, may dissipate heat away from essential components. Additionally, active cooling solutions, may include forced air ventilation and liquid cooling, have been introduced to enhance thermal regulation. To further mitigate heat-related issues, some existing designs incorporate large optical distances in a range of 60 millimetres (mm) to 70 mm between light emitting diode (LED) backlight and optical sheets, thereby reducing direct thermal exposure. While these methods have been effective to some extent, they often introduce design constraints, increase size of a system, and complicate manufacturing processes. Additionally, the large optical distances is necessary to prevent visible luminance variations or LED hot spots. However, this space remains underutilized in existing designs, presenting missed opportunities for thermal management. The large distance helps with light uniformity but does not effectively dissipate significant heat generated by high-luminance LEDs. This can lead to overheating, which affects both performance and longevity of the display.

Moreover, traditional displays, such as liquid crystal displays (LCDs), are designed to function within a standard temperature range. For example, the standard temperature range may lie from +5 degrees Celsius (° C.) to +50° C. This range is suitable for many applications, but in automotive environments, where temperatures can drop to as low as −25° C. during cold winter nights or rise to over +70° C.

under direct sunlight, the traditional displays can falter. In such extreme conditions, the HUD systems may experience delayed start-up, reduced visibility, image distortion, even permanent damage due to an overheating or freezing, and similar. Additionally, the HUD systems must not only withstand these temperature extremes but also become operational swiftly upon starting a vehicle. As a result, the HUD systems fail to function correctly under these extreme temperature conditions until an interior of the vehicle cools down or warms up.

Therefore, in light of the foregoing discussion, there exists a need to overcome the aforementioned drawbacks.

SUMMARY

The aim of the present disclosure is to provide an apparatus, a system, and a method for controlling temperature of a backlight unit of a display system to ensure consistent performance, enhance illumination uniformity, prevent thermal damage, and enhance reliability and longevity of said backlight unit under varying environmental conditions.

The aim of the present disclosure is achieved by an apparatus, a system, and a method for controlling temperature of a backlight unit of a display system, as defined in the appended independent claims to which reference is made to. Advantageous features are set out in the appended dependent claims.

Throughout the description and claims of this specification, the words "comprise", "include", "have", and "contain" and variations of these words, for example "comprising" and "comprises", mean "including but not limited to", and do not exclude other components, items, integers or steps not explicitly disclosed also to be present. Moreover, the singular encompasses the plural unless the context otherwise requires. In particular, where the indefinite article is used, the specification is to be understood as contemplating plurality as well as singularity, unless the context requires otherwise.

BRIEF DESCRIPTION OF THE DRAWINGS

FIGS. 1B and 1C illustrate sectional views of said backlight unit, while FIG. 1D illustrates an exemplary arrangement of a heat exchanger with respect to a hollow heat transfer element of FIGS. 1A-C, in accordance with an embodiment of the present disclosure;

DETAILED DESCRIPTION OF EMBODIMENTS

Figure 1A:
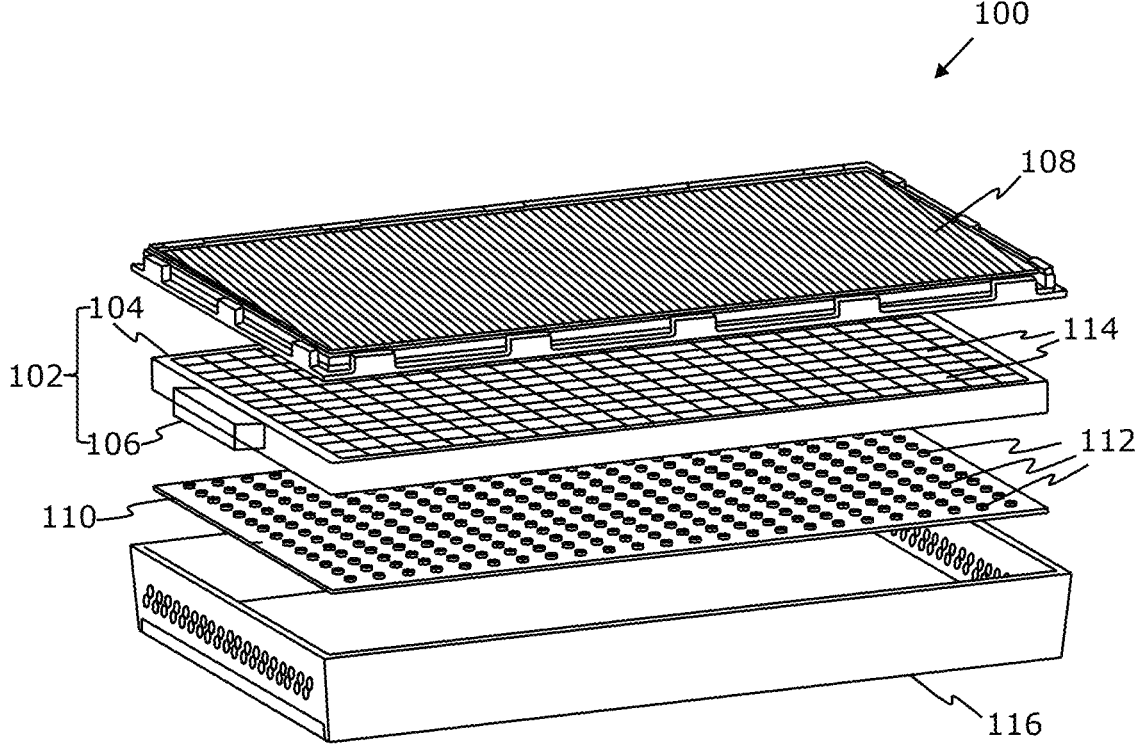
FIGS. 1A, 1B, 1C, and 1D, FIG. 1A illustrates an exploded view of a backlight unit in which an apparatus is used for controlling temperature of said backlight unit.

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, the present disclosure provides an apparatus for controlling temperature of a backlight unit of a display system, wherein the apparatus comprises:

a hollow heat transfer element arranged between one or more optical elements of the backlight unit and a printed circuit board of the backlight unit when the apparatus is in use, wherein a first heat transfer fluid circulates within a hollow space of the hollow heat transfer element when the apparatus is in use, to thermally couple the hollow heat transfer element with at least one of: light-emitting elements arranged on the printed circuit board, the printed circuit board; and a heat exchanger thermally coupled to the hollow heat transfer element when the apparatus is in use, wherein the heat exchanger controls the temperature of the backlight unit to lie within a predefined operating temperature range, by exchange of thermal energy between the heat exchanger and the hollow heat transfer element via the first heat transfer fluid.

In a second aspect, the present disclosure provides a system for controlling temperature of a backlight unit of a display system, wherein the system comprises:

an apparatus for enabling temperature control according to the first aspect, wherein the apparatus is arranged in the backlight unit;

a first temperature sensor operable to measure a first temperature of the backlight unit; and a processor configured to:

receive the first temperature from the first temperature sensor;

detect when the first temperature lies outside a predefined operating temperature range of the display system; and control a heat exchanger of the apparatus to bring the first temperature within the predefined operating temperature range, by exchange of thermal energy between the heat exchanger and a hollow heat transfer element of the apparatus via a first heat transfer fluid circulating within a hollow space of the hollow heat transfer element when the system is in use, upon said detection.

In a third aspect, the present disclosure provides a method for controlling temperature of a backlight unit of a display system, wherein the method comprises:

receiving a first temperature of a backlight unit from a first temperature sensor;

detecting when the first temperature lies outside a predefined operating temperature range of the display system; and controlling a heat exchanger of an apparatus to bring the first temperature within the predefined operating temperature range, by exchange of thermal energy between the heat exchanger and a hollow heat transfer element of the apparatus via a first heat transfer fluid circulating within a hollow space of the hollow heat transfer element when the system is in use, upon said detection.

The present disclosure provides the aforementioned first aspect, the aforementioned second aspect, and the aforementioned third aspect for controlling temperature of the backlight unit of the display system. It will be appreciated that the hollow heat transfer element facilitates heat dissipation generated by the light-emitting elements arranged on the printed circuit board, thereby preventing excessive temperature variations in the backlight unit. The circulation of the first heat transfer fluid enhances thermal coupling between heat-generating components (i.e., the light emitting elements, the printed circuit board, and similar), which enables an effective transfer of the thermal energy. It will also be appreciated that the heat exchanger being thermally coupled to the hollow heat transfer element facilitates an efficient dissipation of heat from the backlight unit, thereby helping to maintain the first temperature within the predefined operating range and reducing risk of thermal-induced performance degradation. The inclusion of the processor configured to receive the first temperature and control the heat exchanger allows for maintaining the backlight unit within the predefined operating temperature range, which helps to improve operational stability and reliability of the display system. Additionally, the hollow heat transfer element includes reflective surfaces, it can direct light from the light-emitting elements towards the one or more optical elements, thereby optimizing efficiency of an output light while also facilitating heat transfer.

Moreover, the method enables adaptive thermal management by ensuring that appropriate thermal energy exchange occurs between the heat exchanger and the hollow heat transfer element via the first heat transfer fluid. It will be appreciated that such an approach provides a structured framework for processing the first temperature and responding to variations in the first temperature. By implementing the method, the backlight unit can be maintained within the predefined operating temperature range, thereby reducing risk of thermal degradation and improving performance and longevity of the display system. Beneficially, the apparatus, the system and the method can be implemented in different types of display systems, allowing for flexible adaptation to various applications. The system and the method are fast, robust, easy to implement, and facilitates efficient thermal management, improved display performance, and enhanced reliability across various operating conditions.

Throughout the present disclosure, the term "apparatus" refers to a physical system or a device designed to perform a specific function or set of functions. Herein, the apparatus is a structured assembly comprising one or more components (i.e., the hollow heat transfer element and the heat exchanger) that work together to achieve temperature control of the backlight unit of the display system. The term "display system" refers to an integrated arrangement of components designed to present visual content to a user (namely, a viewer). The display system comprises a display module and the backlight unit, wherein the display module comprises a display, a display driver, an optical substrate configured for autostereoscopic viewing. The term "display" refers to a device or a panel that serves as primary visual output surface for presenting digital images, text, graphical content, and similar. The display may feature various layers, including backlighting or pixel arrays, to achieve desired brightness, color accuracy, and resolution. Examples of the display may include, but are not limited to, a liquid crystal display (LCD), an organic light-emitting diode (OLED) display, a micro-LED display, an electrophoretic display (EPD), a plasma display, and a projection-based display. Herein, the display is positioned behind the optical substrate, allowing an emitted light to pass through the optical substrate for an enhanced visual effects or for the autostereoscopic viewing. The term "optical substrate" refers to a transparent or a semi-transparent layer placed in a path of light of the display system, which is designed to influence the way light is emitted or perceived. The term "autostereoscopic viewing" refers to a method of displaying three-dimensional (3D) images or 3D videos without a need for special glasses or headgear. The term "backlight unit" refers to a light-emitting element that is capable of illuminating and heating one or more regions of the display by way of producing white light. The backlight unit is commonly used in transmissive or semi-transmissive display technologies, such as in LCDs. The backlight unit is well-known in the art. In an implementation, the backlight unit comprises the apparatus, the one or more optical elements, the light-emitting elements arranged on the printed circuit board, the printed circuit board.

Throughout the present disclosure, the term "hollow heat transfer element" refers to a thermally conductive structure that includes an internal hollow space through which the first heat transfer fluid circulates. The hollow heat transfer element is configured to facilitate thermal coupling between the heat-generating components (such as the light emitting elements and similar) and a heat dissipation mechanism, such as the heat exchanger. The hollow heat transfer element can be made of materials with high thermal conductivity, such as metals or thermally conductive composites, and may incorporate reflective surfaces to optimize the output light in optical applications. The term "heat transfer fluid" refers to a liquid with high thermal conductivity and specific heat capacity, designed to absorb and transfer the thermal energy from one location to another. Examples of the heat transfer fluid may include, but are not limited to, ethylene glycol (commonly used in automotive and industrial cooling systems), mineral oil (used in electrical transformers and some electronics cooling), and synthetic silicone oils (used in high-temperature applications). In an implementation, the first heat transfer fluid circulates within the hollow space of the hollow heat transfer element. The first heat transfer liquid is used in both cooling and heating applications to manage the first temperature of the backlight unit by circulating within the hollow space to transfer the heat to or from essential areas. It will be appreciated that such an approach helps to maintain the predefined operating temperature range of the display system when the apparatus is in use, thus preventing an overheating, optimizing performance, and improving durability of the backlight unit. In addition to dissipating the excess heat, the first heat transfer liquid can also be utilized to transfer the thermal energy into the display system when the display operates in colder environments.

The term "optical element" refers to a component within the backlight unit that interacts with the light to achieve a specific optical function, such as transmission, reflection, diffusion, collimation, focusing, or similar. In the backlight unit of the display system, the optical element may include, but are not limited to, optical sheets, diffusers, lenses, light guides, reflectors, and mirrors. The one or more optical elements are designed to control propagation, distribution, or intensity of light emitted from the light-emitting elements, thereby enhancing uniformity, brightness, and efficiency of the display. The one or more optical elements may be constructed from glass, plastic, or specialized optical materials, depending on required optical characteristics and performance criteria of the display. The term "light-emitting element" refers to a component that emits light when electrically energized. In the backlight unit, the light-emitting elements serve as primary light sources for illuminating the display system. The light-emitting elements generate heat as a byproduct of light emission, necessitating thermal management to ensure stable operation and longevity. Examples of the light-emitting elements may include, but are not limited to, infrared (IR) light-emitting diodes (LEDs), micro-LEDs, visible LEDs, laser diodes, organic OLEDs, and semiconductor lasers.

In an implementation, the hollow heat transfer element is positioned between the one or more optical elements of the backlight unit and the printed circuit board (PCB) to serve as a thermal interface. Such a placement allows the hollow heat transfer element to efficiently mediate heat exchange between the heat-generating components and the heat dissipation mechanism. When the apparatus is in use, the first heat transfer fluid circulates within the hollow space of the hollow heat transfer element. This circulation enhances thermal coupling by facilitating a transfer of heat away from the heat-generating components, ensuring that an excessive heat does not accumulate in the backlight unit. The movement of the first heat transfer fluid helps to distribute the thermal energy more evenly, reducing localized overheating and improving operational stability of the display system. It will be appreciated that by thermally coupling with the at least one of: the light-emitting elements arranged on the printed circuit board, the printed circuit board, the hollow heat transfer element ensures that an excess heat is efficiently transported towards the heat exchanger. This thermal coupling mitigates temperature fluctuations, thereby reducing risk of thermal degradation, performance inconsistencies, or reduced lifespan of the display system.

Optionally, the hollow heat transfer element is designed as a grid of interconnected hollow sub-sections, each hollow sub-section being arranged around at least one respective light-emitting element on the printed circuit board, and wherein each hollow sub-section has one or more reflective surfaces facing a light-emitting region of the at least one respective light-emitting element, such that the reflective surfaces direct the light emitted by the at least one respective light-emitting element towards the one or more optical elements. In this regard, the term "hollow sub-section" refers to an individual segment of the hollow heat transfer element, which forms a part of the grid of interconnected hollow structures. Each hollow sub-section is designed to enclose or surround the at least one corresponding light-emitting element on the printed circuit board. A hollow interior of the hollow sub-sections allows for the circulation of the first heat transfer fluid, enabling thermal coupling between the light-emitting element and the heat exchanger to dissipate the excess heat. Moreover, the term "reflective surface" refers to a surface designed to redirect an incident light through a process of reflection. In the backlight unit, the one or more reflective surfaces are positioned to face the light-emitting region of the at least one respective light-emitting element and is configured to direct the emitted light towards the one or more optical elements. The one or more reflective surfaces may be composed of or coated with materials exhibiting high reflectivity (for example, such as aluminium, silver coatings, dielectric layers, and similar), to minimize light absorption and maximize light efficiency. By controlling an angle and positioning of the one or more reflective surfaces, the emitted light can be efficiently redirected, reducing loss of the light and improving uniformity and brightness in the display system. Moreover, the term "light-emitting region" refers to a specific portion of a light-emitting element from which electromagnetic radiation, particularly visible light, is emitted during operation.

Herein, the hollow heat transfer element is not a single continuous structure but instead consists of multiple hollow sub-sections. These hollow sub-sections are designed as the grid of interconnected hollow sub-sections, ensuring that each light-emitting element has at least one corresponding hollow sub-section surrounding it. The hollow sub-sections provide a modular design that enables effective thermal isolation between adjacent light-emitting elements while still maintaining overall thermal coupling within the backlight unit. The first heat transfer fluid circulates within the grid of interconnected hollow sub-sections. This circulation establishes thermal coupling between the hollow heat transfer element and both the light-emitting elements and the printed circuit board, thereby facilitating heat dissipation from the heat-generating components. The continuous movement of the first heat transfer fluid ensures that the thermal energy is transferred away efficiently, reducing localized overheating. Moreover, each hollow sub-section includes one or more reflective surfaces, these reflective surfaces are specifically oriented towards the light-emitting region of the corresponding light-emitting element. When the light-emitting elements generate the light, the one or more reflective surfaces direct and concentrate emitted light towards the one or more optical elements, thereby optimizing efficiency of said emitted light. It will be appreciated that the hollow heat transfer element being designed as the grid of interconnected hollow sub-sections provides a thermal regulation (i.e., such an approach facilitates heat dissipation through the circulation of the first heat transfer fluid within the hollow heat transfer element). It will also be appreciated that such a design incorporates the one or more reflective surfaces within each hollow sub-section, which improves directionality of the light by redirecting emitted light from the light-emitting elements towards the one or more optical elements light. This design reduces scattering of the light and optical losses, thereby improving luminous efficiency, uniform brightness distribution, and overall performance of the display system.

A technical effect of the aforementioned feature is that it enhances thermal management by facilitating efficient heat dissipation through fluid circulation while simultaneously improving light utilization by directing the emitted light towards the one or more optical elements, thereby optimizing both thermal and optical performance of the display system.

Optionally, the one or more reflective surfaces are implemented as one or more of: a surface made of a reflective material, a surface coated with a reflective coating. In this regard, the term "surface" refers to an external or outermost boundary of a material or a structure that interfaces with its surrounding environment. In a context of optical and thermal systems, the surface may possess specific properties such as reflectivity, emissivity, conductivity, or similar, which influence behavior of the light, the heat, or other physical interactions. Moreover, the term "reflective material" refers to a substance that exhibits a high degree of reflectivity (i.e., the reflective material efficiently redirects an incident light rather than absorbing or transmitting it). Examples of the reflective material may include, but are not limited to, metals (such as aluminium, silver, gold, and the like), and coatings with high-reflectivity properties. The reflective material is used in optical applications to enhance light efficiency and minimize losses due to scattering or absorption. Moreover, the term "reflective coating" refers to a thin layer of material applied to a surface to increase its reflectivity. Such a coating can be metallic (e.g., an aluminium coating, a silver coating, and the like) or dielectric (e.g., multi-layer interference coating, and the like) and are designed to optimize redirection of the light for optical and display applications. The reflective coating is commonly used in mirrors, optical components, and display backlighting to improve control of the light and efficiency of the display system.

In an implementation, when the one or more reflective surfaces are implemented as the surface made of the reflective material, the surface itself is inherently designed to exhibit high reflectivity without requiring additional treatment. In this case, the material composition of the surface plays an essential role in its optical performance. It will be appreciated that such an approach ensures durability and long-term stability, as the reflective properties are an inherent characteristic of the material itself, thereby minimizing degradation over time. Additionally, using a solid reflective material can enhance thermal conductivity, aiding in heat dissipation alongside the light management. Optionally, when the one or more reflective surfaces are implemented as the surface coated with the reflective coating, the underlying surface material does not necessarily need to be inherently reflective. Instead, a thin layer of a high-reflectivity material, such as metallic or dielectric coatings, is deposited onto the surface to enhance its optical properties. It will be appreciated that such an approach allows for greater flexibility in material selection, as non-reflective or lower-cost substrates can be used while still achieving high reflectivity. The reflective coating can be customized to optimize specific wavelengths, enhance uniformity, and minimize light absorption, leading to improved optical efficiency.

A technical effect of implementing the one or more reflective surfaces as one or more of: the surface made of the reflective material, the surface coated with the reflective coating is that it enhances efficiency of the light by reducing light loss and improving uniformity in the display system. Additionally, such an approach optimizes thermal performance by preventing an excessive heat absorption in non-light-emitting regions, thereby improving the reliability and longevity of the backlight unit.

Optionally, the hollow heat transfer element is made from at least one of: a transparent material, a translucent material. In this regard, the term "transparent material" refers to a material that allows transmission of the light with minimal scattering or absorption, enabling clear visibility of objects through it. Such a material exhibits high optical clarity and low attenuation of an incident light. Examples of the transparent material may include, but are not limited to, a glass, an acrylic, and a polycarbonate, which are commonly used in optical and display applications to facilitate propagation of the light without significant distortion. It will be appreciated that the hollow heat transfer element being made from the transparent material allows for minimal optical interference while enabling efficient heat dissipation. This ensures that the light emitted by the light-emitting elements passes through without significant loss or distortion, maintaining high optical clarity and brightness. Additionally, the hollow heat transfer element being made of the transparent material facilitates integration with optical components without affecting light transmission, making it particularly useful in display and illumination systems where maintaining direct light output is essential.

Moreover, the term "translucent material" refers to a material that permits transmission of the light while diffusing it, causing objects behind it to appear blurred rather than clearly visible. The translucent material scatters the light to varying degrees, depending on its composition and surface characteristics. Examples of the translucent material may include, but are not limited to, a frosted glass, a diffusive polymer, and certain ceramics, which are used in applications where controlled light diffusion is required to achieve uniform illumination while reducing glare or direct visibility. It will be appreciated that the hollow heat transfer element being made from the translucent material provides controlled light diffusion, reducing glare and ensuring a more uniform distribution of the light across optical elements. This improves an overall uniformity of the display while still allowing heat dissipation through circulating the first heat transfer fluid. Additionally, the translucent material can help mitigate hot spots by diffusing intense light from individual light-emitting elements, enhancing visual comfort and performance in applications requiring soft, evenly distributed illumination.

A technical effect of the hollow heat transfer element made from the at least one of: the transparent material, the translucent material is that it enables simultaneous heat dissipation and light transmission, optimizing both thermal management and optical performance. Such an approach minimizes unwanted light absorption while improving uniform brightness across the display system, leading to enhanced efficiency, reliability, and visual quality.

Optionally, the first heat transfer fluid is at least one of: a liquid, a gas. In this regard, the term "liquid" refers to a state of matter characterized by a definite volume but no fixed shape, allowing it to conform to a shape of its container. Liquids exhibit fluidity, relatively high density, and incompressibility under standard conditions. In thermal management applications, the liquid serves as a heat transfer medium by absorbing, transporting, and dissipating the thermal energy through conduction and convection. Examples of the liquid may include, but are not limited to, a water (commonly used in in cooling systems due to its high specific heat capacity and thermal conductivity), and thermal oils (used in industrial heat exchangers and electronic cooling applications to transfer heat efficiently). Moreover, the term "gas" refers to a state of matter that has neither a fixed shape nor a definite volume, allowing it to expand to fill any container. Gases exhibit low density, high compressibility, and the ability to flow freely. In thermal management applications, the gas functions as a heat transfer medium by facilitating heat dissipation through convection, diffusion, or phase-change processes such as evaporation and condensation. Examples of the gas may include, but are not limited to, an air (used in in cooling systems, such as forced air cooling in electronics and heat exchangers), and helium (applied in cryogenic cooling due to its low density and high thermal conductivity).

In an operation, when the liquid is used as the first heat transfer fluid, the liquid flows through the hollow heat transfer element, absorbing the heat from the light-emitting elements and the printed circuit board. Due to its high thermal capacity, the liquid efficiently transports the absorbed heat to the heat exchanger, where it dissipates the excess thermal energy before recirculating. It will be appreciated that using the liquid as the first heat transfer fluid enables efficient heat absorption and transport due to its high thermal conductivity and specific heat capacity, thereby preventing localized overheating and ensuring stable operation of the light-emitting elements and the printed circuit board. It will also be appreciated that the use of the liquid facilitates enhanced thermal uniformity across the backlight unit, reducing temperature gradients and thereby improving overall longevity and performance of the display system.

Optionally, when the gas is used as the first heat transfer fluid, the gas circulates within the hollow heat transfer element and absorbs the heat through convection. Gases generally have lower thermal conductivity than liquids but can still facilitate effective cooling when combined with high-flow circulation mechanisms or phase-change processes (e.g., evaporative cooling, and similar). It will be appreciated that using the gas as the first heat transfer fluid allows for a lightweight and low-maintenance thermal management system, as gases do not require pumps or complex sealing mechanisms, reducing complexity of the apparatus and potential leakage risks. It will also be appreciated that gas-based heat transfer can be particularly advantageous in applications requiring rapid thermal response, as gases can quickly adapt to temperature changes and, when combined with phase-change mechanisms like evaporative cooling, enhance overall heat dissipation efficiency.

A technical effect of the first heat transfer fluid being at least one of: the liquid, the gas, is that the apparatus can be adapted to different thermal management needs by selecting an appropriate fluid. This flexibility enables enhanced heat dissipation efficiency, prevents localized overheating, and ensures reliable operation of the backlight unit under varying thermal conditions.

Optionally, the first heat transfer fluid manipulates the light emitted by the light-emitting elements by performing at least one of: reflection, refraction, diffraction, re-distribution, of said light. In this regard, the term "reflection" refers to a process where the first heat transfer fluid alters a direction of the light emitted by the light-emitting elements by bouncing it off an interface within the hollow heat transfer element. This occurs when the first heat transfer fluid has reflective properties or interfaces with different refractive indices, enabling redirection of the light emitted by the light-emitting elements towards the one or more optical elements. It will be appreciated that such an approach of manipulating the light emitted by the light-emitting elements can enhance optical efficiency by directing more light towards the one or more optical elements, minimizing unwanted light loss, and improving the overall brightness and uniformity of illumination. Moreover, the term "refraction" refers to a process when the first heat transfer fluid causes the light emitted by the light-emitting elements to bend as it passes through regions of varying refractive indices within the hollow heat transfer element. By leveraging the refraction, the apparatus can control the directionality of the light, ensuring optimal light spreading, focusing, or collimation. Such controlled light manipulation enhances energy efficiency and illumination precision.

Moreover, the term "diffraction" refers to a process where the first heat transfer fluid interacts with the emitted light from the light-emitting elements, altering its propagation due to microstructures, interfaces, or variations in fluid density. It will be appreciated that such an effect can be used to control an angular dispersion of the light, enhancing uniformity in illumination or directing specific wavelengths towards the one or more optical elements. Moreover, the term "re-distribution" refers to a controlled modification of spatial pattern of light propagation due to presence of the first heat transfer fluid. This occurs through scattering, diffusion, or internal reflections, ensuring a more uniform and efficient illumination of the one or more optical elements while reducing glare and hotspots. It will be appreciated that by eliminating the glare and reducing intensity hotspots, the re-distribution process enhances uniform illumination, improving visual performance and minimizing energy losses in the display system.

A technical effect of the first heat transfer fluid manipulating the light emitted by the light-emitting elements by performing the at least one of: reflection, refraction, diffraction, re-distribution, of said light is that it enhances optical efficiency and uniformity of the emitted light while simultaneously maintaining effective thermal management. Such a functionality improves performance of the display, reduces energy losses, and ensures consistent brightness across the backlight unit.

Throughout the present disclosure, the term "heat exchanger" refers to a device that facilitates transfer of heat between two mediums (for example, such as a fluidic medium, a solid medium, or similar), in order to regulate or maintain temperature of the backlight unit. Herein, the heat exchanger achieves thermal coupling with the hollow heat transfer element through conduction, convection, or a combination of both. The first heat transfer fluid circulating within the hollow heat transfer element absorbs the thermal energy from the heat-generating components. Once the heat is transferred to the hollow heat transfer element, it is directed towards the heat exchanger, where the thermal energy is either dissipated into surrounding environment (via air, liquid, or other cooling methods) or transferred to another medium for cooling. Notably, the heat exchanger is used for both heating and cooling mechanism of the backlight unit. It will be appreciated that the heat exchanger may include features like fins, tubes, radiators, and similar, that increase surface area for heat dissipation, thereby enabling effective cooling. A technical effect of this feature is that it enhances thermal management of the backlight unit by ensuring efficient heat dissipation or absorption, depending on temperature regulation needs of the apparatus.

Optionally, the heat exchanger is arranged on at least one side of the hollow heat transfer element. In an implementation, the heat exchanger can be arranged on the at least one side of the hollow heat transfer element through different coupling methods. For example, such methods may comprise any one of: a direct contact method (i.e., the heat exchanger may be in physical contact with the hollow heat transfer element, allowing efficient heat conduction), a fluid coupling method (i.e., a thermally conductive interface such as a liquid or thermal grease may be used between the hollow heat transfer element and the heat exchanger to facilitate improved thermal transfer), a convective cooling method (i.e., the heat exchanger may include fins, liquid cooling channels, or airflow mechanisms, such as fans to enhance the dissipation of the heat extracted from the first heat transfer fluid). A technical effect of arranging the heat exchanger on the at least one side of the hollow heat transfer element is that it enhances heat dissipation efficiency by optimizing thermal pathway from the light-emitting elements to an external cooling environment. Such a configuration prevents localized overheating, ensures stable performance of the light-emitting elements, and extends operational lifespan of the apparatus. Additionally, it enables flexible integration into various device designs by allowing customization of placement of the heat exchanger based on spatial and thermal management requirements.

Optionally, the heat exchanger is arranged physically separate from the hollow heat transfer element when the apparatus is in use, the apparatus further comprising a fluidic channel between the heat exchanger and the hollow heat transfer element, and wherein a second heat transfer fluid circulates within the fluidic channel when the apparatus is in use, to thermally couple the hollow heat transfer element with the heat exchanger. In this regard, the term "fluidic channel" refers to a defined passage, a conduit, or a pathway that facilitates controlled movement of the second heat transfer fluid when the apparatus is in use. The fluidic channel may have a specific geometry, such as a tube, a pipe, a microchannel, an enclosed cavity, and similar, designed to regulate fluid flow dynamics, pressure, and heat transfer efficiency. When the apparatus is in use, the second heat transfer fluid transfers heat from the hollow heat transfer element to the heat exchanger. The second heat transfer fluid circulates within the fluidic channel, and primarily acts as a thermal conduit without directly manipulating the light.

Herein, the fluidic channel serves to transport the second heat transfer fluid between the hollow heat transfer element and the heat exchanger to achieve efficient thermal coupling. Herein, the second heat transfer fluid (which could be a liquid, a gas, or a phase-change material) circulates through the fluidic channel, carrying thermal energy away from the hollow heat transfer element to the heat exchanger, where the heat is dissipated into the surrounding environment. The circulation of the second heat transfer fluid can be achieved through natural convection (i.e., driven by density differences), forced convection (i.e., using pumps or fans), and similar. The fluidic channel can be designed as tubing, microchannels, or enclosed conduits that efficiently guide the second heat transfer fluid between the hollow heat transfer element and the heat exchanger. The system may employ heat pipes, liquid cooling loops, phase-change materials, and similar, to enhance the thermal coupling between the hollow heat transfer element and the heat exchanger. It will be appreciated that the presence of the fluidic channel ensures efficient thermal management by enabling controlled heat transfer between the hollow heat transfer element and the heat exchanger. It will also be appreciated that the use of the fluidic channel allows flexibility in a design of the apparatus, enabling the heat exchanger to be positioned at an optimal location, separate from a heat source, thereby facilitating better heat dissipation.

A technical effect of physically separating the heat exchanger from the hollow heat transfer element and introducing the fluidic channel with circulating the second heat transfer fluid is that it improves thermal management flexibility, enabling efficient heat dissipation without requiring direct contact. Such a setup facilitates heat removal at a displace location, allowing the apparatus to be integrated into space-constrained designs while maintaining the predefined operating temperature range for the display system.

The present disclosure also relates to the second aspect as described above. Various embodiments and variants disclosed above, with respect to the aforementioned first aspect, apply mutatis mutandis to the second aspect.

The present disclosure also relates to the third aspect as described above. Various embodiments and variants disclosed above, with respect to the aforementioned first aspect and the aforementioned second aspect, apply mutatis mutandis to the third aspect.

Throughout the present disclosure, the apparatus is arranged within the backlight unit and operates by circulating the first heat transfer fluid within the hollow heat transfer element. The first heat transfer fluid absorbs excess heat from the printed circuit board and/or light-emitting elements, transferring the heat to the heat exchanger, which dissipates or regulates thermal energy, ensuring that the backlight unit remains within the predefined operating temperature range. By thermally coupling with the heat-generating components and dynamically adjusting heat dissipation, the apparatus maintains optimal thermal conditions within the backlight unit. It will be appreciated that arrangement of the apparatus within the backlight unit facilitates direct thermal management of critical components, enhancing operational efficiency and longevity. It will also be appreciated that integration of the heat transfer element and the heat exchanger enables precise temperature regulation, reducing the risk of overheating while ensuring consistent performance of the display system.

Throughout the present disclosure, the term "temperature sensor" refers to a sensor that is capable of sensing a temperature of a given region of the backlight unit. Examples of the temperature sensor may include, but are not limited to, an infrared sensor, a thermocouple, and a thermistor. All the aforesaid types of temperature sensors and their working principles are well-known in the art. The term "first temperature sensor" refers to a sensor that is capable of measuring the first temperature of the backlight unit. The first temperature sensor may be arranged in proximity to the backlight unit. The first temperature sensor works by using a temperature-sensing element to detect changes in the first temperature of the backlight unit. The first temperature sensor converts temperature-related physical properties (like electrical resistance or voltage) into a signal that can be interpreted by the processor. A primary purpose of the first temperature sensor is to monitor the first temperature of the backlight unit in real-time or in near real-time. Notably, temperature regulation is essential for proper functioning and longevity of electronic displays, as excessive heat can cause performance degradation, malfunction, even permanent damage to the display system. Thus, by measuring the first temperature of the backlight unit, the processor of the system can take proactive measures to prevent overheating and maintain the display system within the predefined operating temperature range. A technical effect of this feature is that it enables the system to continuously monitor and regulate the first temperature at critical areas of the display system, ensuring that the system operates within safe and optimal thermal conditions.

Throughout the present disclosure, the term "processor" refers to a computational element that is operable to execute the software framework. Examples of the processor may include, but are not limited to, a microprocessor, a microcontroller, a complex instruction set computing (CISC) microprocessor, a reduced instruction set computing (RISC) microprocessor, a very long instruction word (VLIW) microprocessor, or any other type of processing circuit. Notably, the processor is communicably coupled to the heat exchanger, the first temperature sensor, and optionally, to a second temperature sensor.

Throughout the present disclosure, the first temperature sensor measures the first temperature and transmits this information as a temperature value to the processor. The processor is configured to continuously or periodically read these temperature values as part of a feedback loop for thermal regulation. It will be appreciated that the ability to receive real-time temperature data from the first temperature sensor enables the processor to monitor thermal state of the display system continuously, ensuring immediate detection of any deviation from the predefined operating temperature range. The process of detecting the first temperature involves continuous or periodic monitoring of temperature data received from the first temperature sensor. It will be appreciated that when it is detected that the first temperature lies outside the predefined operating temperature range, conditions that may lead to thermal stress, overheating, inadequate performance, or similar, can be optionally proactively determined by the processor, thereby protecting heat sensitive components and enhancing reliability of the display system.

Then, the processor is configured to compare the first temperature to the predefined operating temperature range. Notably, the term "predefined operating temperature range" refers to a temperature range within which the display system is operable, i.e., being able to present any virtual content. Optionally, when the display system comprises a liquid-crystal display (LCD), the predefined operating temperature range lies between +5 degree Celsius (° C.) to +50°

C. Moreover, for an automotive applications or displays requiring optical transparency, the predefined operating temperature range lies between −25° C. to +70° C. This range is determined based on thermal tolerance and performance requirements of elements of the display system, ensuring that the first temperature within the predefined operating temperature range support consistent functionality, image quality, and durability.

In this regard, when the first temperature of the display system lies outside the predefined operating temperature range, there is a likelihood of a first region of the display system is non-operational, i.e., not being able to present any virtual content. In other words, the first temperature of the first region is either too high (for example, when the display system is employed in an extremely hot surrounding environment) or too low (for example, when the display system is employed in an extremely cold surrounding environment), for it to present any virtual content.

It is to be noted that such an non-operational behaviour may occur until the first region of the display system is allowed to cool down (i.e., dissipate some heat) or to warm-up (i.e., generate some heat) after the display system is switched on, such that the first temperature of the display system reaches within the predefined operational temperature range. Thus, in this regard, the processor is configured to activate and control the heat exchanger, wherein the heat exchanger is employed to control the first temperature of the display system accordingly, i.e., to bring the first temperature within the predefined operating temperature range. The heat exchanger, being thermally coupled to the hollow heat transfer element, facilitates transfer of the thermal energy to or from the display system to bring the first temperature back within the predefined operating temperature range via the first heat transfer fluid. In a case where the first temperature of the display system is below the predefined operating temperature range, the heat exchanger is utilised to increase the temperature of the display system by heating up the first region. In another case where the first temperature of the display system is above the predefined operating temperature range, the heat exchanger is utilised to decrease the temperature of the display system by cooling down the first region. It will be appreciated that controlling the heat exchanger to adjust the first temperature within the predefined operating temperature range provides an efficient means of thermal management, maintaining optimal operating conditions without manual intervention, and thus extending lifespan of the display system and ensuring consistent visual quality.

Optionally, the hollow heat transfer element and the first temperature sensor are arranged within a housing of the backlight unit, said housing also having arranged therein one or more optical elements of the backlight unit and a printed circuit board of the backlight unit on which light-emitting elements are arranged. In this regard, the term "housing" refers to an enclosure, a casing, a structural component, and similar, that provides mechanical support, protection, and environmental isolation for an internal components of the system. The housing may be formed from thermally conductive or insulating materials, depending on the required heat dissipation characteristics. The housing may also include internal compartments, mounting structures, ventilation features, and similar, to optimize airflow and thermal management. It will be appreciated that the housing provides structural integrity, ensuring that all internal components of the system remain properly aligned and function as intended. It will also be appreciated that the housing minimizes exposure to environmental contaminants such as dust, moisture, external mechanical forces, and similar, thereby enhancing the reliability and longevity of the system.

A technical effect of the arranging the hollow heat transfer element, the first temperature sensor, the one or more optical elements of the backlight unit, and the printed circuit board of the backlight unit within the housing is that it enhances thermal stability and optical efficiency of the backlight unit by ensuring all the aforesaid components of the system operate within a controlled environment. The integration within the housing reduces heat dissipation inefficiencies, prevents light leakage, and simplifies system integration by consolidating thermal and optical components into a single unit. This results in improved durability, better performance, and streamlined manufacturing of the backlight unit.

Optionally, the display system is implemented in a device, and wherein the system further comprises a second temperature sensor that is operable to measure a second temperature of an external environment of the device, and wherein the processor is further configured to:

receive the second temperature from the second temperature sensor;
  detect when the second temperature lies outside the predefined operating temperature range of the display system; and
  control the heat exchanger to bring the first temperature within the predefined operating temperature range, by exchange of thermal energy between the heat exchanger and the hollow heat transfer element via the first heat transfer fluid, upon said detection.

In this regard, the term "device" refers to a machine or an apparatus that provides an operational environment for the display system and associated components. The term "second temperature" refers to a temperature value measured of the external environment of the device. Herein, the second temperature sensor may be arranged in proximity to the device to measure the external temperature around the device. The second temperature sensor provides real-time temperature data to the processor, enabling continuous evaluation of whether the second temperature lies within the predefined operating temperature range of the display system. In this regard, if the second temperature is within the predefined operating temperature range, the display system continues normal operation without intervention. However, if the second temperature lies outside the predefined range, the processor is configured to initiate corrective actions. Notably, when the second temperature of the external environment of using the display system is out of the predefined operating temperature range, it can be understood that the temperature of the display system would also be out of said range. So, in such a case, the first temperature of the display system is brought into the predefined operating temperature range. In this way, the processor is configured to activate the heat exchanger to regulate the first temperature of the display system. The thermal energy is transferred through the hollow heat transfer element to maintain or bring the first temperature within the predefined operating temperature range. Herein, if the second temperature is too high, the heat exchanger dissipates an excess heat away from the display system. Similarly, if the second temperature is too low, the heat exchanger could redistribute the heat to the display system, preventing it from falling below the predefined operating temperature range. It will be appreciated that this arrangement ensures consistent performance of the display system, maintaining optimal brightness, colour accuracy, and responsiveness even in challenging environmental conditions. It will also be appreciated that monitoring and regulating the first temperature of the display system based on the second temperature of the external environment enhances thermal stability, preventing performance degradation or damage caused by temperature extremes.

A technical effect of the aforementioned feature is that the system autonomously regulates the first temperature of the display system in response to the external environmental conditions, ensuring reliable operation within the predefined operating temperature range and preventing the system from exceeding or falling below the predefined operating temperature range at any time.

Optionally, the device is a vehicle, and wherein the display system is a head-up display system. In this regard, the term "head-up display system" refers to a display that is capable of displaying an image to the user present in the vehicle. It will be appreciated that the head-up display (HUD) system is utilized to present visual information represented in the image to the user, without requiring the user to look considerably away from his/her usual viewpoint (for example, when looking towards a road on which the vehicle is being driven). Herein, the term "visual information" encompasses colour information represented in the image, and additionally, optionally other attributes (for example, such as depth information, illuminance information, transparency information, and the like) associated with the image. The vehicle could, for example, be a car, a truck, an aircraft, a speed boat, or the like. The car could be a convertible car or a hardtop car. The vehicle could also be a semi-open vehicle (for example, such as a boat). It will also be appreciated that the HUD could be a two-dimensional (2D) HUD that is capable of displaying images in a 2D manner i.e., without any depth perception, or be a 3D HUD that is capable of displaying images in an autostereoscopic manner, for example, by way of producing a synthetic light field. Head-up displays and their forms are well-known in the art. A technical effect of the aforementioned feature is that an integration of the HUD system in the vehicle with temperature control capabilities ensures that the HUD system operates within the predefined operating temperature range. This maintains optimal performance of the HUD system, prevents overheating or undercooling, thus ensuring longevity and reliability of the HUD system under varying environmental conditions. Additionally, this integration ensures that the HUD system remains within the predefined operating temperature range, while also considering constraints of battery capacity to maintain optimal performance and prevent thermal damage.

Optionally, the hollow heat transfer element and the first temperature sensor are arranged within a housing of the backlight unit, said housing also having arranged therein one or more optical elements of the backlight unit and a printed circuit board of the backlight unit on which light-emitting elements are arranged.

Optionally, the display system is implemented in a device, the method further comprising:

receiving a second temperature of an external environment of the device, from a second temperature sensor that is operable to measure the second temperature;
  detecting when the second temperature lies outside the predefined operating temperature range of the display system; and
  controlling the heat exchanger to bring the first temperature of the display system within the predefined operating temperature range, by exchange of thermal energy between the heat exchanger and the hollow heat transfer element via the first heat transfer fluid, upon said detection.

Experimental Part

In an exemplary experimental part, an effect of the hollow heat transfer element on LED illumination performance was assessed. Such an approach evaluates how said hollow heat transfer element when incorporated influences distribution, intensity, and directionality of the light emitted by the light-emitting elements, compared to the backlight unit without the hollow heat transfer element (as in a prior art case). The comparison provides insights into thermal and optical efficiency improvements, highlighting areas for potential optimization in LED-based display backlighting.

Figures 3A, 3B:
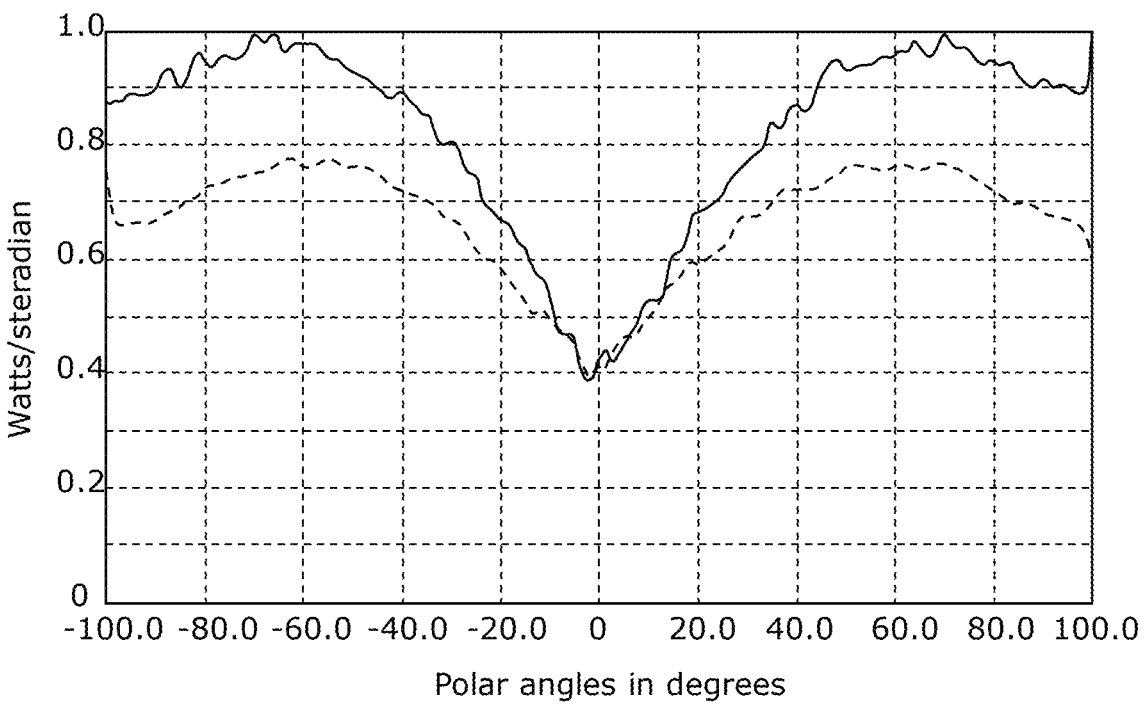
FIGS. 3A-F, illustrate a graphical representation of an exemplary experimentation part conducted using an apparatus of FIG. 1A, in accordance with an embodiment of the present disclosure.

In one implementation, the backlight unit was tested without the hollow heat transfer element, serving as a baseline condition to evaluate optical performance of the system. An illumination was assessed at different measurement points to observe light intensity distribution and uniformity across an output surface of the backlight unit. Firstly, a radiant intensity of the emitted light was assessed as a function of a polar angle. In such a case, the light intensity varies significantly with the polar angle, indicating non-uniform illumination. It was observed a drop in the light intensity around a central axis, suggesting the presence of light scattering and uneven brightness distribution (as shown in FIG. 3A). Secondly, the illumination was assessed at different distances, for example, at 5 millimetres (mm) and 15 mm from a source to measure light intensity profile and light dispersion. In this regard, at a distance of 5 mm, it was observed a peak irradiance values concentrated in a narrow region with the light intensity sharply decreasing toward edges. This pattern indicates that the emitted light is not uniformly spread across the surface, resulting in localized hot spots and uneven brightness. Further, at a distance of 15 mm, it was observed that the irradiance profile exhibited a broader distribution compared to the 5 mm measurement. The peak intensity was lower, but the light spread more evenly across a measurement area. However, despite the increased dispersion, the irradiance still showed a noticeable central peak with gradual intensity falloff toward the edges, indicating residual non-uniformity in brightness distribution. This suggests that without the hollow heat transfer element, the system experiences significant variations in the light intensity due to uncontrolled scattering and inadequate optical diffusion.

In another implementation, said backlight unit was evaluated with the hollow heat transfer element integrated into a design of the said backlight unit. The hollow heat transfer element functions as both a thermal management and an optical enhancement feature, directing the light more efficiently. Under this condition, an output light shows an improvement in directional intensity (as shown in FIG. 3D). Similarly, the irradiance profiles at 5 mm and 15 mm distances indicate significantly improved light concentration in the desired direction, thereby minimizing scattered losses. Compared to the baseline case, the irradiance distribution forms a more consistent and smooth peak, demonstrating improved light uniformity and reduced localized intensity variations. Additionally, it was observed that the hollow heat transfer element integrated into the backlight unit of the display system contributed to both cooling and improved optical efficiency. It will be appreciated that observed improvement in the output light and directionality suggests that the hollow heat transfer element effectively enhances performance of the backlight unit by reducing thermal degradation and improving light collimation.

The experimental part can be studied in conjunction with FIGS. 3A, 3B, 3C, 3D, 3E, and 3F.

DETAILED DESCRIPTION OF THE DRAWINGS

Figure 1B:
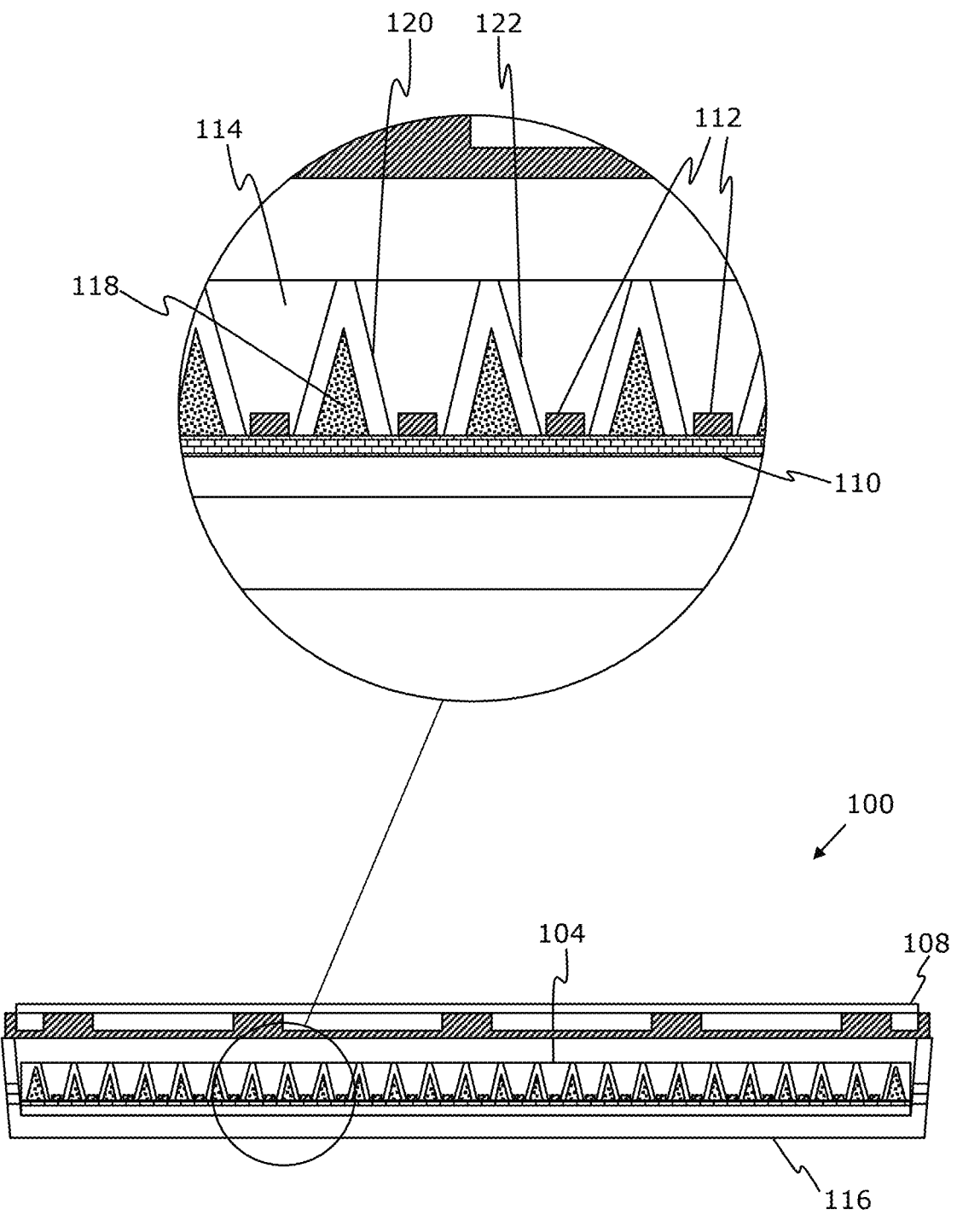
Figure 1C:
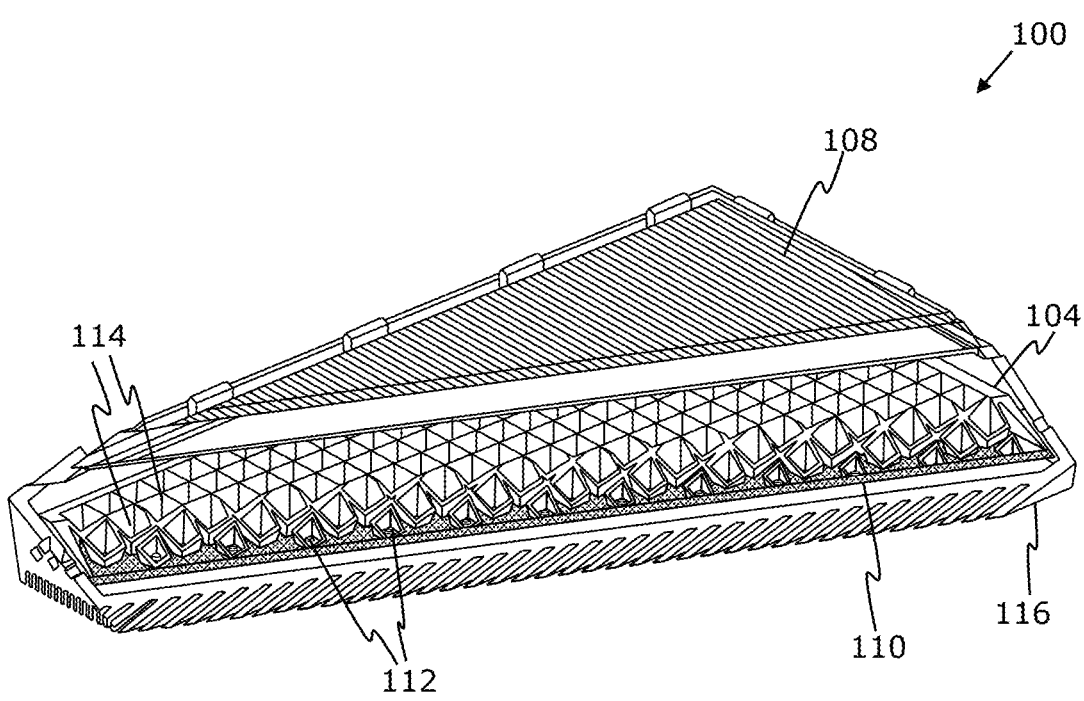
Figure 1D:
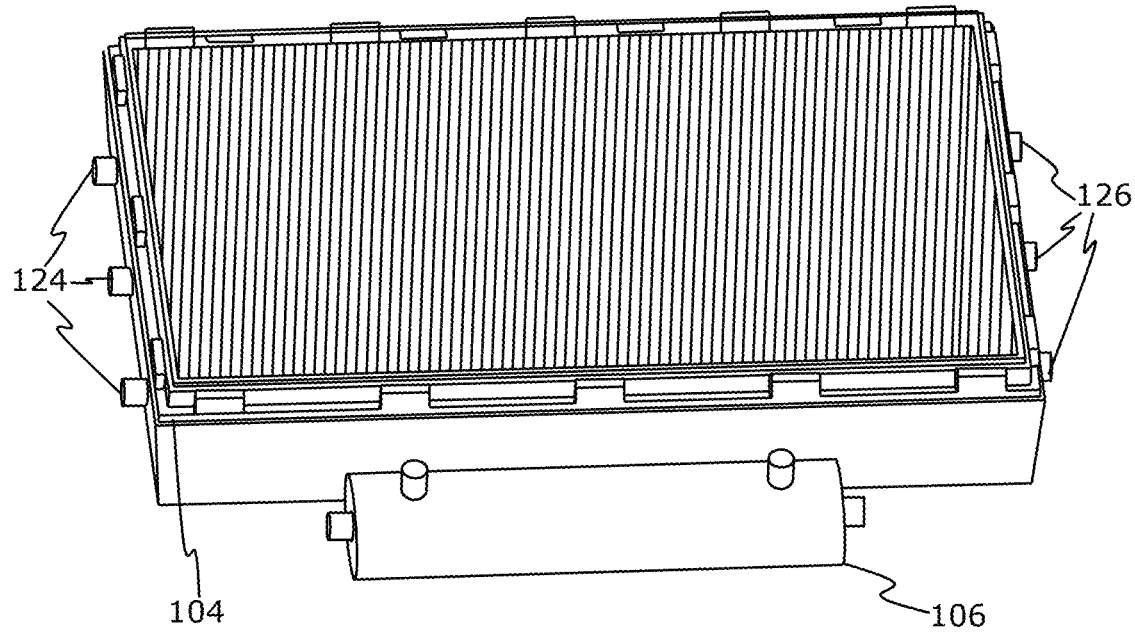

Referring to FIGS. 1A, 1B, 1C, and 1D, FIG. 1A is an exploded view of a backlight unit 100 in which an apparatus 102 is used for controlling temperature of said backlight unit 100 of a display system, FIGS. 1B and 1C are sectional views of said backlight unit 100, while FIG. 1D is an exemplary arrangement of a heat exchanger 106 with respect to a hollow heat transfer element 104 of FIGS. 1A-C, in accordance with an embodiment of the present disclosure.

In FIG. 1A, the apparatus 102 comprises the hollow heat transfer element 104 and the heat exchanger 106. Herein, the heat exchanger 106 is thermally coupled to the hollow heat transfer element 104 when the apparatus 102 is in use, wherein the heat exchanger 106 controls the temperature of the backlight unit 100 to lie within a predefined operating temperature range, by exchange of thermal energy between the heat exchanger 106 and the hollow heat transfer element 104 via a first heat transfer fluid. Optionally, the heat exchanger 106 is arranged on at least one side of the hollow heat transfer element 104.

With reference to FIGS. 1A, 1B, and 1C, the hollow heat transfer element 104 is arranged between one or more optical elements (for example, depicted as optical elements 108) of the backlight unit 100 and a printed circuit board 110 of the backlight unit 100 when the apparatus 102 is in use. As shown, light-emitting elements 112 are arranged on the printed circuit board 110. Further, the hollow heat transfer element 104 is designed as a grid of interconnected hollow sub-sections 114. Moreover, there is shown a housing 116, wherein said housing 116 having arranged therein the hollow heat transfer element 104, the optical elements 108 of the backlight unit 100 and the printed circuit board 110 of the backlight unit 100 on which the light-emitting elements 112 are arranged.

Moreover, in FIG. 1B, there is shown a sectional view of the backlight unit 100, in which various components of said backlight unit 100 are shown in zoomed-in view for clarity. Herein, the first heat transfer fluid (for example, for the sake of clarity as shown by dotted pattern hatching, depicted as 118) circulates within a hollow space of the hollow heat transfer element 104 when the apparatus 102 is in use, to thermally couple the hollow heat transfer element 104 with at least one of: the light-emitting elements 112 arranged on the printed circuit board 110, the printed circuit board 110. Herein, each hollow sub-section 114 being arranged around at least one respective light-emitting element 112 on the printed circuit board 110, and wherein each hollow sub-section 114 has one or more reflective surfaces (for example, depicted as reflective surfaces 120, 122) facing a light-emitting region of the at least one respective light-emitting element 110, such that the reflective surfaces direct the light emitted by the at least one respective light-emitting 110 towards the optical elements 108. Moreover, in FIG. 1C, there is shown a sectional view of the backlight unit 100.

Moreover, in FIG. 1D, the heat exchanger 106 (not shown for the sake of clarity) is thermally coupled to the hollow heat transfer element 104. Optionally, there is shown that the heat exchanger 106 is arranged physically separate from the hollow heat transfer element 104. Also, there is shown an inlet/outlet of hot liquid/gas (depicted by 124) and an inlet/outlet of cooled liquid/gas (depicted by 126), indicating a mechanism by which heat is extracted from the backlight unit 100 through the heat exchanger 106 and dissipated to maintain an optimal temperature for enhanced display performance.

FIGS. 1A-D are merely examples, which should not unduly limit the scope of the claims herein. A person skilled in the art will recognize many variations, alternatives, and modifications of embodiments of the present disclosure.

Figure 2:
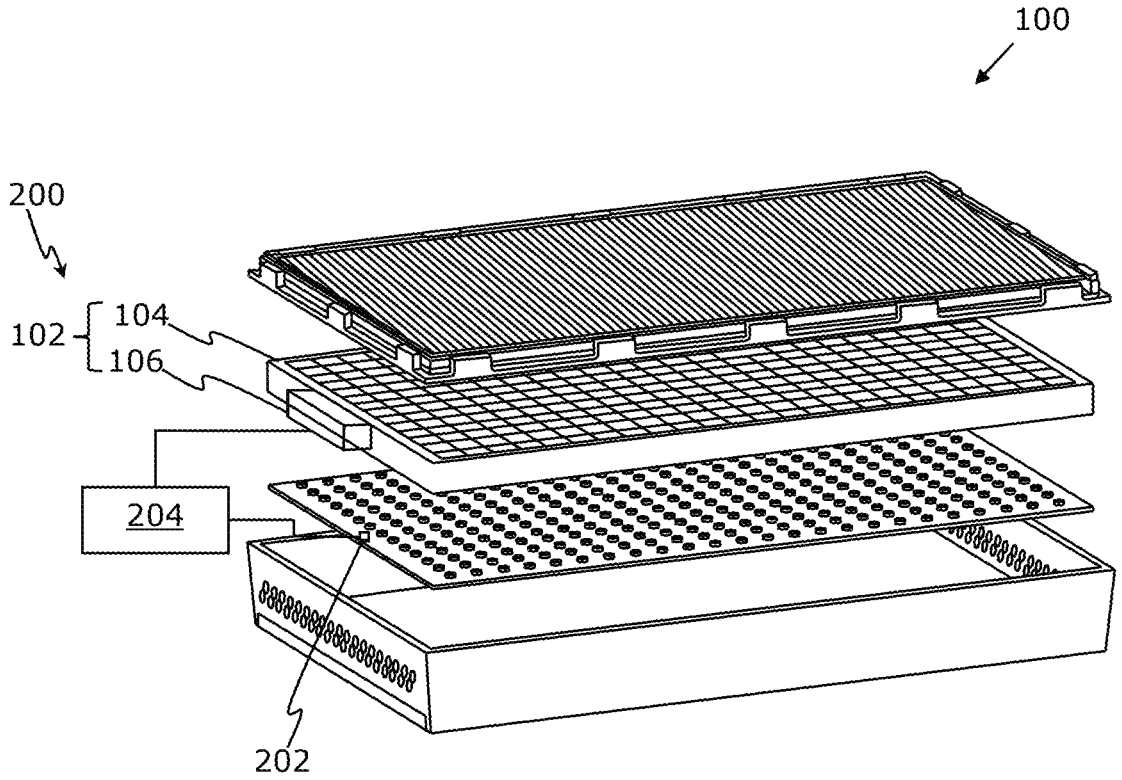
FIG. 2 illustrates a schematic illustration of a system for controlling temperature of the backlight unit of a display system using FIG. 1A, in accordance with an embodiment of the present disclosure.

Referring to FIG. 2, illustrated is a schematic illustration of a system 200 for controlling temperature of the backlight unit 100 of a display system using FIG. 1A, in accordance with an embodiment of the present disclosure. Herein, the system 200 comprises the apparatus 102 for enabling temperature control, a first temperature sensor 202 operable to measure a first temperature of the backlight unit 100, and a processor 204. Herein, the processor 204 is communicably coupled to the first temperature sensor 202 and the heat exchanger 106 of the apparatus 102. The processor 204 is configured to perform various operations, as described earlier with respect to the aforementioned second aspect.

FIG. 2 is merely an example, which should not unduly limit the scope of the claims herein. A person skilled in the art will recognize many variations, alternatives, and modifications of embodiments of the present disclosure.

Referring to FIGS. 3A, 3B, 3C, 3D, 3E, and 3F, illustrated is a graphical representation of an exemplary experimentation part conducted using an apparatus of FIG. 1A, to determine an effect of integration of a hollow heat transfer element on an optical performance of a backlight unit, in accordance with an embodiment of the present disclosure. In FIGS. 3A and 3D, a vertical axis (depicted as Y-axis) represents variation in radiant intensity measured in Watts per Steradian, and a horizontal axis (depicted as X-axis) represents a polar angle measured in degrees. In FIGS. 3B, 3C, 3E, and 3F, a vertical axis (depicted as Y-axis) represents variation in incoherent irradiance, and a horizontal axis (depicted as X-axis) represents a Y-coordinate value indicating spatial position along a measurement plane.

Figure 3C:
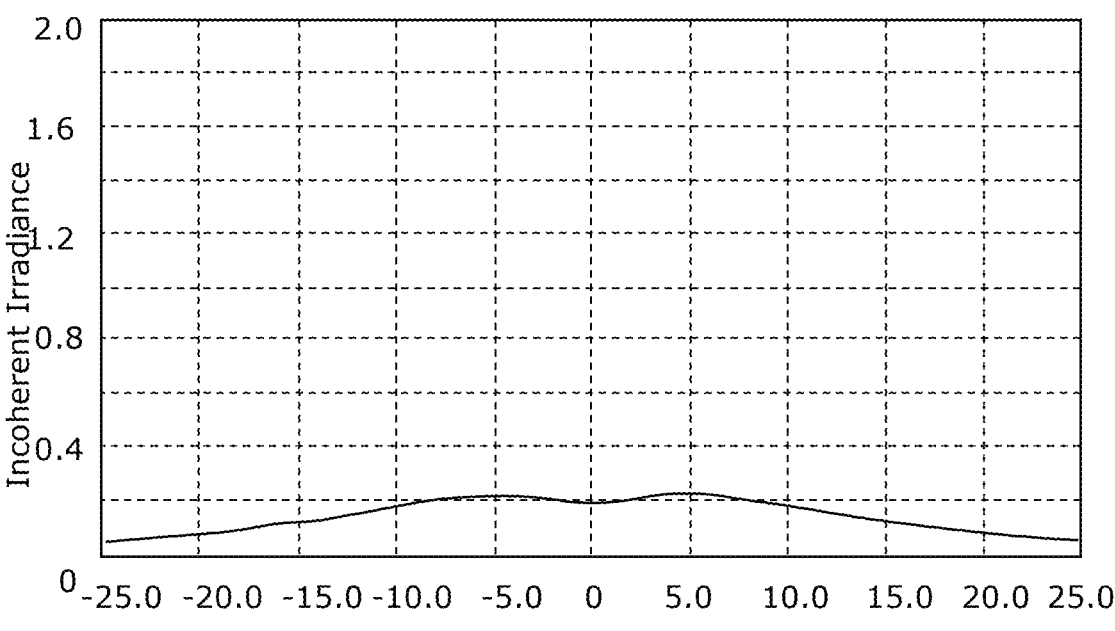
Figure 3D:
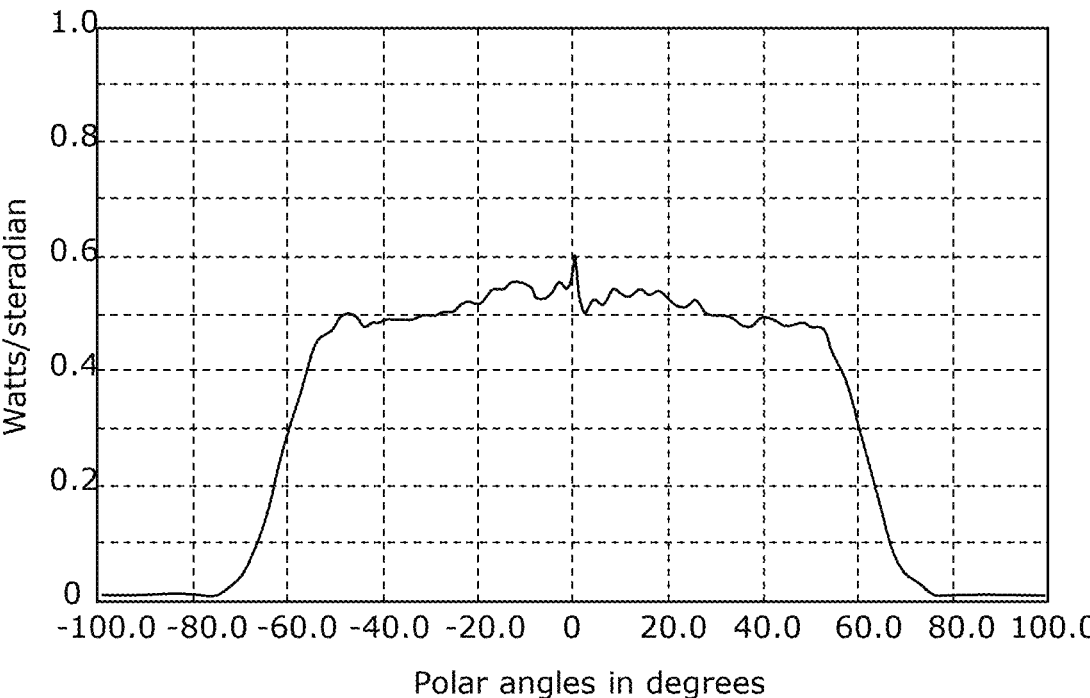

With reference to FIG. 3A-C, a baseline condition was represented, wherein the backlight unit was tested without the hollow heat transfer element. In FIG. 3A, the radiant intensity as a function of a polar angle exhibits significant variations, with a notable drop near the central axis, indicating non-uniform illumination. The intensity profile suggests scattered emission with potential losses in efficiency.

FIGS. 3B and 3C illustrate the incoherent irradiance distribution at measurement distances of 5 millimetres (mm) and 15 mm from a light source, respectively. At 5 mm, FIG. 3B shows a concentrated peak irradiance in a localized region, with sharp intensity fall-off towards the edges, resulting in non-uniform brightness. FIG. 3C, measured at 15 mm, presents a broader dispersion of light, but the intensity remains relatively uneven, suggesting presence of localized hot spots.

Figure 3E:
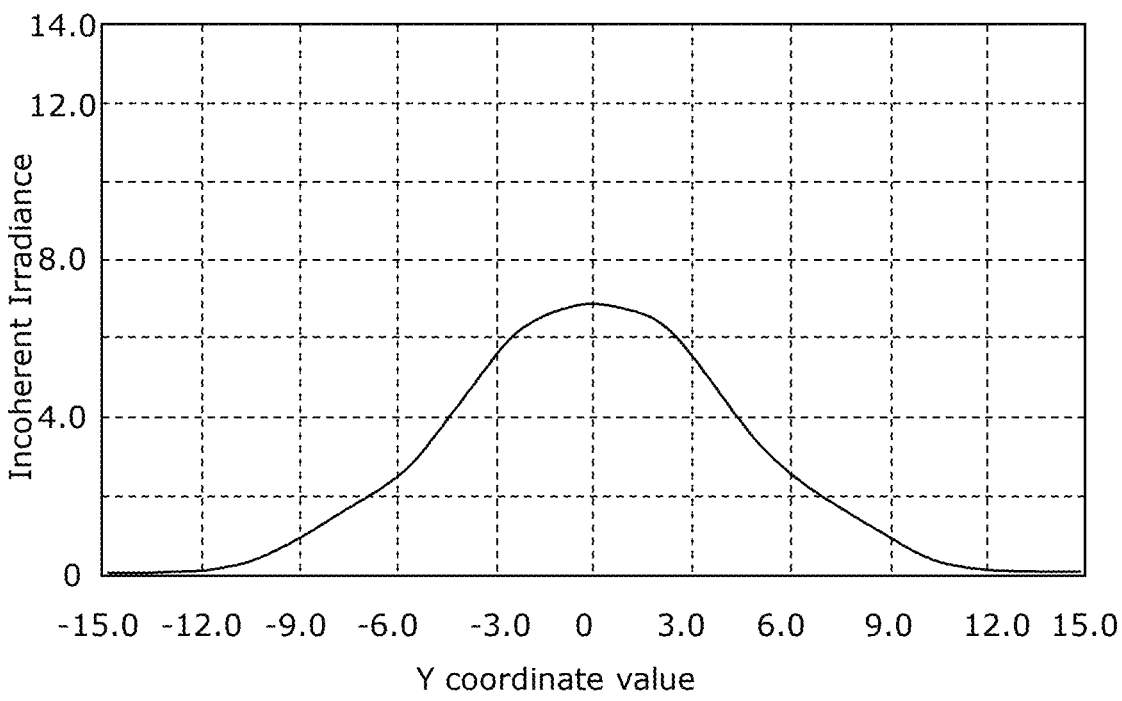
Figure 3F:
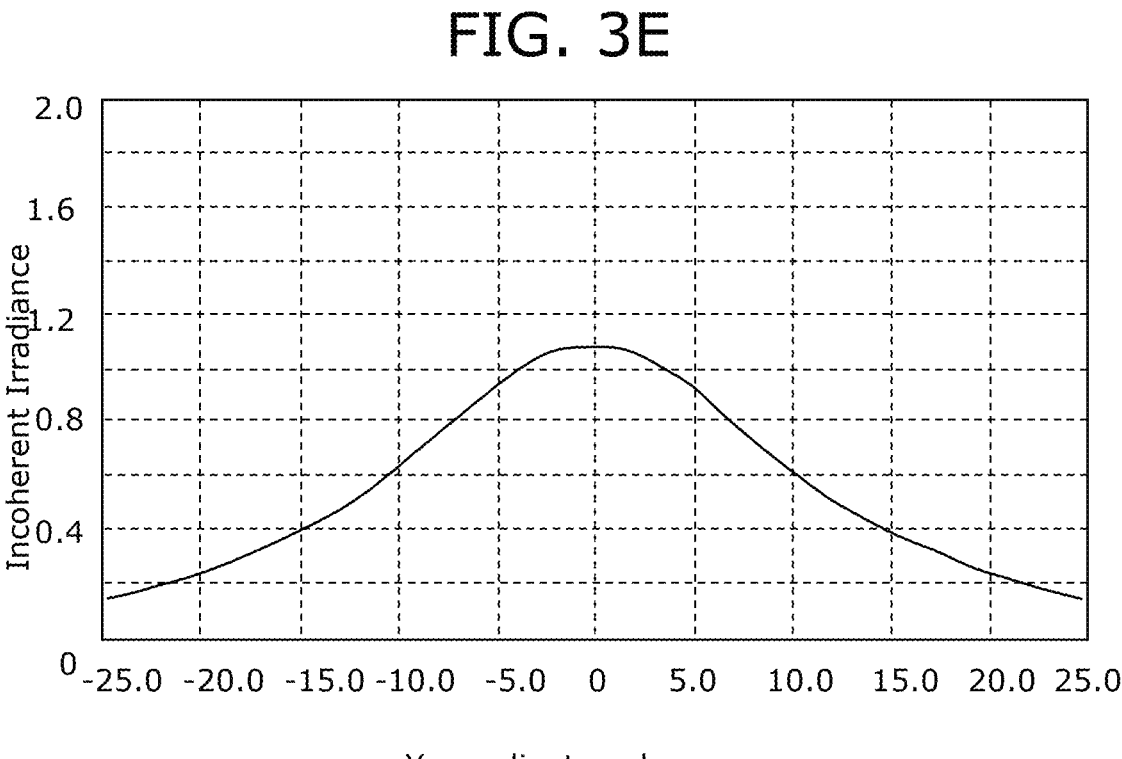

With reference to FIG. 3D-F, illustrate optical performance of the backlight unit when the hollow heat transfer element is integrated. In FIG. 3D, the radiant intensity profile shows a more uniform distribution across the polar angle range, reducing central-axis intensity dips and enhancing overall efficiency. In FIG. 3E, the irradiance measurement at 5 mm demonstrates a more even spread of light compared to FIG. 3B, minimizing intensity peaks and improving uniformity. Similarly, in FIG. 3F, representing the irradiance at 15 mm, indicates a well-distributed emission pattern with reduced variations, confirming the role of the hollow heat transfer element in optimizing light uniformity and reducing localized brightness inconsistencies.

FIGS. 3A-F are merely examples, which should not unduly limit the scope of the claims herein. A person skilled in the art will recognize many variations, alternatives, and modifications of embodiments of the present disclosure.

Figure 4:
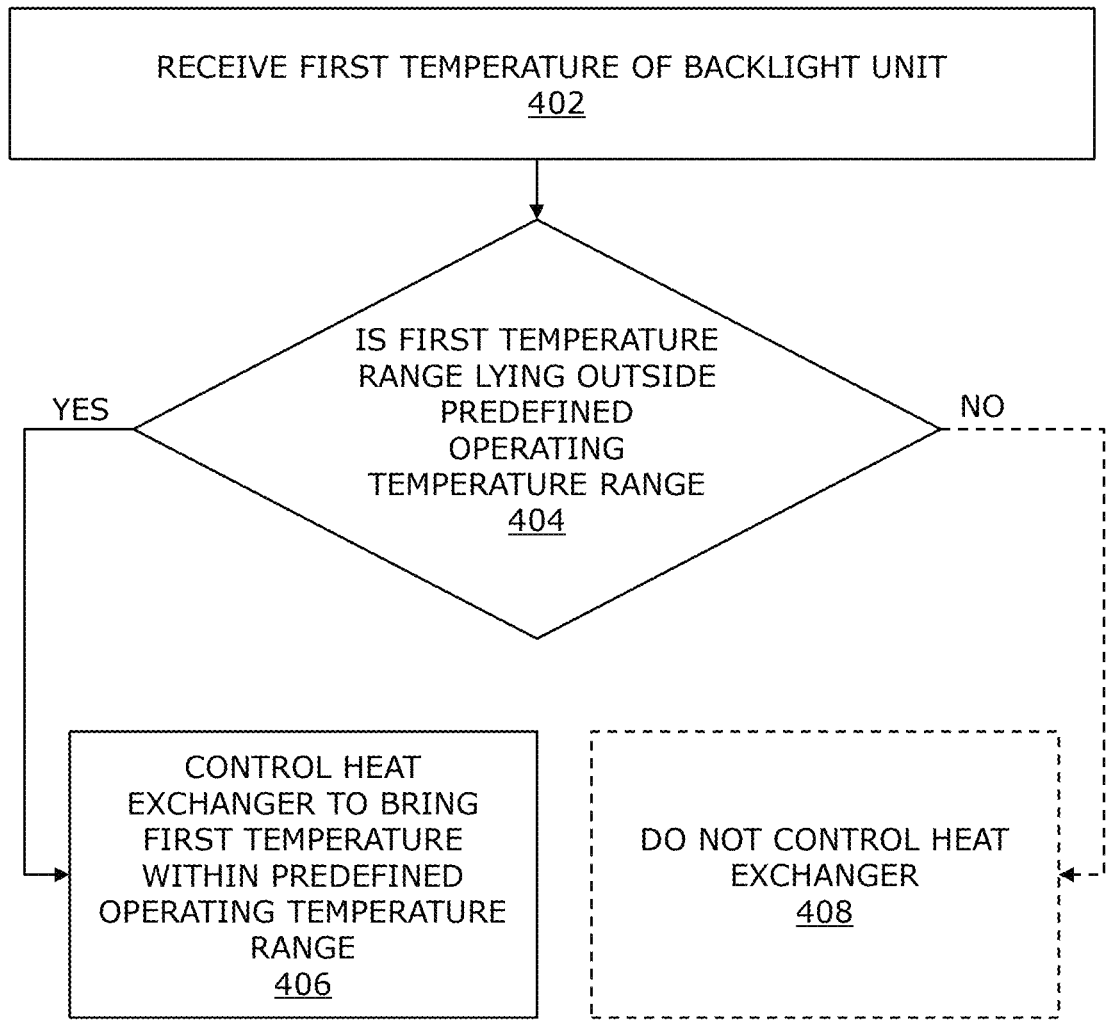
FIG. 4 illustrates steps of a method for controlling temperature of a backlight unit of a display system, in accordance with an embodiment of the present disclosure.

Referring to FIG. 4, illustrated are steps of a method for controlling temperature of a backlight unit of a display system, in accordance with an embodiment of the present disclosure. At step 402, a first temperature of a backlight unit is received from a first temperature sensor. At step 404, it is detected whether the first temperature lies outside a predefined operating temperature range of the display system. When it is detected that the first temperature lies outside the predefined operating temperature range of the display system, at step 406, a heat exchanger is controlled to bring the first temperature within the predefined operating temperature range, by exchange of thermal energy between the heat exchanger and a hollow heat transfer element of the apparatus via a first heat transfer fluid circulating within a hollow space of the hollow heat transfer element when the system is in use, upon said detection. At step 408, when it is detected the first temperature lies in a predefined operating temperature range of the display system, the heat exchanger is not controlled.

The aforementioned steps are only illustrative and other alternatives can also be provided where one or more steps are added, one or more steps are removed, or one or more steps are provided in a different sequence without departing from the scope of the claims herein.

The invention claimed is:

1. An apparatus for controlling temperature of a backlight unit of a display system, wherein the apparatus comprises:
   a hollow heat transfer element arranged between one or more optical elements of the backlight unit and a printed circuit board of the backlight unit when the apparatus is in use, wherein a first heat transfer fluid circulates within a hollow space of the hollow heat transfer element when the apparatus is in use, to thermally couple the hollow heat transfer element with at least one of: light-emitting elements arranged on the printed circuit board, the printed circuit board; and
   a heat exchanger thermally coupled to the hollow heat transfer element when the apparatus is in use, wherein the heat exchanger controls the temperature of the backlight unit to lie within a predefined operating temperature range, by exchange of thermal energy between the heat exchanger and the hollow heat transfer element via the first heat transfer fluid;
   wherein the first heat transfer fluid manipulates the light emitted by the light-emitting elements by performing at least one of: reflection, refraction, diffraction, re-distribution, of said light.

2. The apparatus of claim 1, wherein the hollow heat transfer element is designed as a grid of interconnected hollow sub-sections, each hollow sub-section being arranged around at least one respective light-emitting element on the printed circuit board, and wherein each hollow sub-section has one or more reflective surfaces facing a light-emitting region of the at least one respective light-emitting element, such that the reflective surfaces direct the light emitted by the at least one respective light-emitting element towards the one or more optical elements.

3. The apparatus of claim 2, wherein the one or more reflective surfaces are implemented as one or more of: a surface made of a reflective material, a surface coated with a reflective coating.

4. The apparatus of claim 1, wherein the hollow heat transfer element is made from at least one of: a transparent material, a translucent material.

5. The apparatus of claim 1, wherein the first heat transfer fluid is at least one of: a liquid, a gas.

6. The apparatus of claim 1, wherein the heat exchanger is arranged on at least one side of the hollow heat transfer element.

7. The apparatus of claim 1, wherein the heat exchanger is arranged physically separate from the hollow heat transfer element when the apparatus is in use, the apparatus further comprising a fluidic channel between the heat exchanger and the hollow heat transfer element, and wherein a second heat transfer fluid circulates within the fluidic channel when the apparatus is in use, to thermally couple the hollow heat transfer element with the heat exchanger.

8. A system for controlling temperature of a backlight unit of a display system, wherein the system comprises:

an apparatus for enabling temperature control, wherein the apparatus is arranged in the backlight unit and comprises:

a hollow heat transfer element arranged between one or more optical elements of the backlight unit and a printed circuit board of the backlight unit when the apparatus is in use, wherein a first heat transfer fluid circulates within a hollow space of the hollow heat transfer element when the apparatus is in use, to thermally couple the hollow heat transfer element with at least one of: light-emitting elements arranged on the printed circuit board, the printed circuit board; and a heat exchanger thermally coupled to the hollow heat transfer element when the apparatus is in use, wherein the heat exchanger controls the temperature of the backlight unit to lie within a predefined operating temperature range, by exchange of thermal energy between the heat exchanger and the hollow heat transfer element via the first heat transfer fluid; wherein the first heat transfer fluid manipulates the light emitted by the light-emitting elements by performing at least one of: reflection, refraction, diffraction, re-distribution, of said light;

a first temperature sensor operable to measure a first temperature of the backlight unit; and a processor configured to:

receive the first temperature from the first temperature sensor;

detect when the first temperature lies outside a predefined operating temperature range of the display system; and control the heat exchanger of the apparatus to bring the first temperature within the predefined operating temperature range, by exchange of thermal energy between the heat exchanger and the hollow heat transfer element of the apparatus via the first heat transfer fluid circulating within the hollow space of the hollow heat transfer element when the system is in use, upon said detection.

9. The system according to claim 8, wherein the hollow heat transfer element and the first temperature sensor are arranged within a housing of the backlight unit, said housing also having arranged therein the one or more optical elements of the backlight unit and the printed circuit board of the backlight unit on which light-emitting elements are arranged.

10. The system according to claim 8, wherein the display system is implemented in a device, and wherein the system further comprises a second temperature sensor that is configured to measure a second temperature of an external environment of the device, and wherein the processor is further configured to:

receive the second temperature from the second temperature sensor;

detect when the second temperature lies outside the predefined operating temperature range of the display system; and control the heat exchanger to bring the first temperature within the predefined operating temperature range, by exchange of thermal energy between the heat exchanger and the hollow heat transfer element via the first heat transfer fluid, upon said detection.

11. The system according to claim 10, wherein the device is a vehicle, and wherein the display system is a head-up display system.

12. A method for controlling temperature of a backlight unit of a display system, wherein the method comprises:

receiving a first temperature of a backlight unit from a first temperature sensor;

detecting when the first temperature lies outside a predefined operating temperature range of the display system; and controlling a heat exchanger of an apparatus to bring the first temperature within the predefined operating temperature range, by exchange of thermal energy between the heat exchanger and a hollow heat transfer element of the apparatus via a first heat transfer fluid circulating within a hollow space of the hollow heat transfer element when the system is in use, upon said detection, wherein the hollow heat transfer element is arranged between one or more optical elements of the backlight unit and a printed circuit board of the backlight unit when the apparatus is in use, the first heat transfer fluid circulating within a hollow space of the hollow heat transfer element when the apparatus is in use thermally coupling the hollow heat transfer element with at least one of: light-emitting elements arranged on the printed circuit board, the printed circuit board; and the heat exchanger is thermally coupled to the hollow heat transfer element when the apparatus is in use, wherein the first heat transfer fluid manipulates the light emitted by the light-emitting elements by performing at least one of: reflection, refraction, diffraction, re-distribution, of said light.

13. The method according to claim 12, wherein the hollow heat transfer element and the first temperature sensor are arranged within a housing of the backlight unit, said housing also having arranged therein one or more optical elements of the backlight unit and a printed circuit board of the backlight unit on which light-emitting elements are arranged.

14. The method according to claim 12, wherein the display system is implemented in a device, the method further comprising:

receiving a second temperature of an external environment of the device, from a second temperature sensor that is operable to measure the second temperature;

detecting when the second temperature lies outside the predefined operating temperature range of the display system; and controlling the heat exchanger to bring the first temperature of the display system within the predefined operating temperature range, by exchange of thermal energy between the heat exchanger and the hollow heat transfer element via the first heat transfer fluid, upon said detection.

* * * * *